(12) United States Patent
Toda

(10) Patent No.: US 7,589,586 B2
(45) Date of Patent: Sep. 15, 2009

(54) HIGH FREQUENCY SIGNAL DETECTION CIRCUIT

(75) Inventor: Hiroyuki Toda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 84 days.

(21) Appl. No.: 11/984,749

(22) Filed: Nov. 21, 2007

(65) Prior Publication Data

US 2008/0169873 A1 Jul. 17, 2008

(30) Foreign Application Priority Data

Jan. 17, 2007 (JP) ............................. 2007-007993

(51) Int. Cl.
*H03D 3/00* (2006.01)
(52) U.S. Cl. ............... 329/315; 329/369; 330/75; 330/150; 330/154; 330/127; 330/288; 331/23; 331/25; 331/28; 331/44; 331/108 R; 331/117 FE; 331/172; 331/173; 331/177 R; 331/185; 375/240; 375/324; 375/353; 375/354
(58) Field of Classification Search .............. 329/315, 329/369; 330/150, 154, 127, 75, 288; 331/23, 331/25, 28, 44, 108 R, 117 FE, 172, 173, 331/177 R, 185; 375/240, 324, 353, 354
See application file for complete search history.

(56) References Cited

U.S. PATENT DOCUMENTS

| | | | | |
|---|---|---|---|---|
| 5,229,732 A | * | 7/1993 | Furutani et al. ............. 330/277 |
| 5,327,583 A | * | 7/1994 | Yamada et al. .............. 455/572 |
| 5,446,419 A | * | 8/1995 | Miya et al. .................... 331/99 |
| 5,576,713 A | * | 11/1996 | Suzuki et al. ................ 342/174 |
| 6,028,491 A | * | 2/2000 | Stanchak et al. .............. 331/75 |
| 6,429,800 B1 | * | 8/2002 | Richmond .................... 342/14 |
| 7,039,372 B1 | * | 5/2006 | Sorrells et al. .............. 455/118 |
| 7,082,171 B1 | * | 7/2006 | Johnson et al. ............. 375/316 |
| 7,271,662 B2 | * | 9/2007 | Akamine et al. ............ 330/310 |
| 7,389,091 B2 | * | 6/2008 | Tanaka ........................ 455/126 |
| 2002/0171483 A1 | * | 11/2002 | Shinjo et al. ................ 330/136 |
| 2003/0139159 A1 | * | 7/2003 | Young ........................ 455/217 |
| 2005/0200417 A1 | * | 9/2005 | Diorio et al. ................. 330/277 |
| 2008/0019433 A1 | * | 1/2008 | Yamanouchi et al. ....... 375/224 |

FOREIGN PATENT DOCUMENTS

JP 2561023 B 12/1995

\* cited by examiner

*Primary Examiner*—Arnold Kinkead
*Assistant Examiner*—Richard Tan
(74) *Attorney, Agent, or Firm*—Rabin & Berdo, P.C.

(57) ABSTRACT

A high frequency signal detection circuit includes an input terminal for a high frequency signal to be detected, a switch transferring the high frequency signal as intermittent ringing signal to a first node in response to a pulse signal whose frequency is lower than that of the high frequency signal, a transistor amplifying the signal at the first node, and outputting to a second node, a bias generator generating a bias voltage by which the transistor is operated in its weak inversion region, a resonant circuit outputting the bias voltage to the first node, and resonating the high frequency signal, a capacitor removing a high frequency component of the signal at the second node; and a judgment circuit judging whether or not the high frequency signal is inputted by detecting the signal at the second node, which has the same frequency as the pulse signal.

8 Claims, 3 Drawing Sheets

HIGH FREQUENCY SIGNAL DETECTION CIRCUIT

CROSS-REFERENCE TO RELATED APPLICATION

This application claims the priority benefit of Japanese Patent Application No. 2007-007993, filed Jan. 17, 2007, the entire disclosure of which is incorporated herein by reference.

BACKGROUND OF THE INVENTION

1. Field of the Invention

The invention relates to a high frequency signal detection circuit used in the radio communication device, detecting a very small high frequency signal inputted from an antenna.

2. Description of the Related Art

Japanese patent 2,561,023 discloses a conventional high frequency signal level detection circuit. Under the '023 Japanese patent, the circuit detects a level of a high frequency signal by detecting the signal by a semiconductor diode. Under the circuit, the bias voltage for the use of the detection of the semiconductor diode is changed into three levels periodically. Then, the circuit calculates a static characteristic at that time from the diode currents over two voltages that are the second and the third voltages, which are greater than the suitable electrical potential for the signal detection, and adds the suitable electrical potential on the first voltage and amends an output of the detection by calculating the signal detection efficiency.

As described in the '023 Japanese patent, when the high frequency signal is detected by a semiconductor diode, the signal to be detected is required to be large enough. Thus, a very small high frequency signal received at an antenna should not be applied to a semiconductor diode directly. Accordingly, a high frequency amplifier circuit is generally disposed between the antenna and the detection circuit. However, there is a problem that a high frequency amplifier circuit consumes large power. For this reason, a circuit having a source-follower type amplifier for amplifying an input signal received at an antenna is proposed. However, under the use of the source-follower type amplifier, amplitude of the output becomes smaller than that of the input. Thus, in order to detect a small signal, another amplifier is required to be disposed at the preceding stage or at the subsequent stage.

SUMMARY OF THE INVENTION

An objective of the invention is to solve the above-described problem and to provide a high frequency signal detection circuit, which can effectively detect a high frequency signal with low power consumption without using any amplifiers which consume a large power supply current, such as a high frequency amplifying circuit.

The objective is achieved by a high frequency signal detection circuit including an input terminal for a high frequency signal to be detected, a switch transferring the high frequency signal as intermittent ringing signal to a first node in response to a pulse signal whose frequency is lower than that of the high frequency signal, a transistor amplifying the signal at the first node, and outputting to a second node, a bias generator generating a bias voltage by which the transistor is operated in its weak inversion region, a resonant circuit outputting the bias voltage to the first node, and resonating the high frequency signal, a capacitor removing a high frequency component of the signal at the second node; and a judgment circuit judging whether or not the high frequency signal is inputted by detecting the signal at the second node, which has the same frequency as the pulse signal.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention is explained together with drawings as follows. In each drawing, the same reference numbers designate the same or similar components.

The First Embodiment

Figure 1:
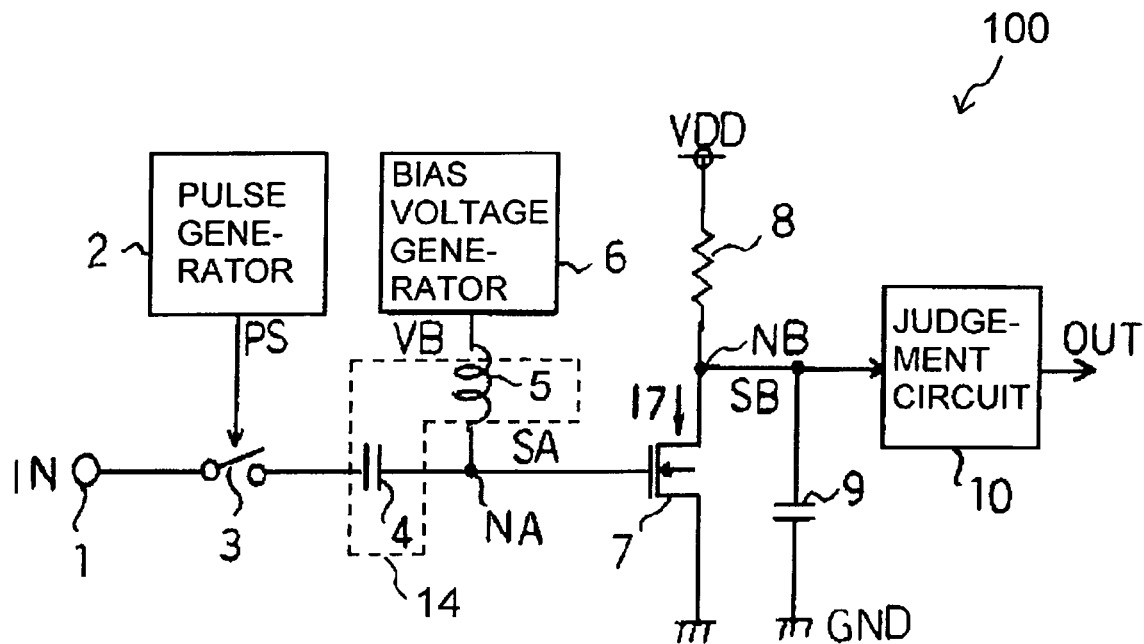
FIG. 1 is a circuit diagram of a high frequency signal detection circuit, according to the first embodiment.

FIG. 1 is a high frequency signal detection circuit 100, according to the first embodiment of the invention. The high frequency signal detection circuit 100 includes an input terminal 1 at which a high frequency signal IN with 5 GHz to be detected is applied. The input terminal 1 is connected to one end of a first capacitor 4 though a switch 3, which is on/off controlled in response to a pulse signal PS with 16 kHz, which is applied from a pulse generator 2. The other end of the first capacitor 4 is connected to a first node NA. The first node NA is connected to a bias voltage generator 6 via an inductor 5, and is connected to a gate of an N channel MOSFET (hereinafter called an NMOS).

The first capacitor 4 has a function for cutting a direct current component of the high frequency signal IN, and creates a resonant circuit 14 together with the inductor 5. The resonant circuit 14 is set to be synchronized with the frequency of the high frequency signal IN. The bias voltage generator 6 generates and supplies a direct-current bias voltage VB, which is less than the threshold voltage (Vth) of the NMOS 7, to the gate of the NMOS 7. The source and the drain of the NMOS 7 are connected to the ground GND and a second node NB, respectively. The second node NB is connected to the power supply voltage VDD via a load resistance, and also is connected to the ground GND via second capacitor 9 for signal-smoothing by removing the high frequency component.

Furthermore, the second node is connected to a judgment circuit 10 for judging whether or not a signal inputted has the same frequency as the pulse signal PS generated in the pulse generator 2. The judgment circuit 10 outputs an output signal OUT as a result of the detection of the high frequency signal IN.

Figure 2:
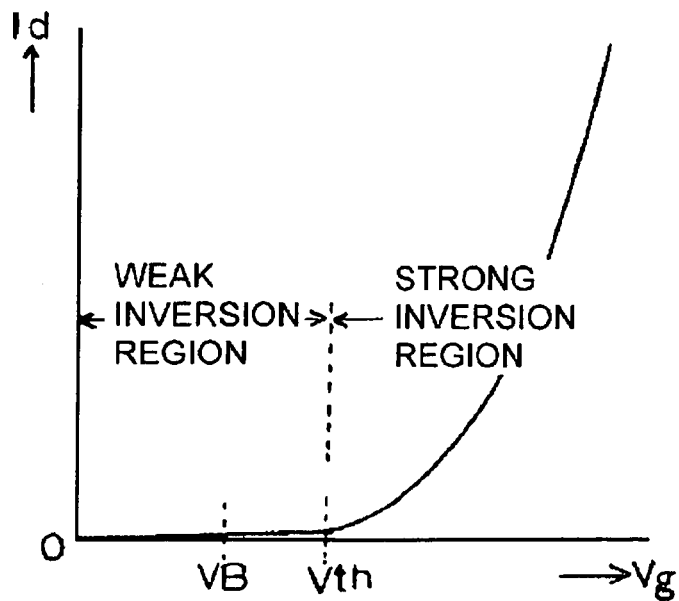
FIG. 2 is volt-ampere curve showing a relationship between a gate voltage and a drain current of an N type MOS FET used in the circuit of FIG. 1.
Figure 3:
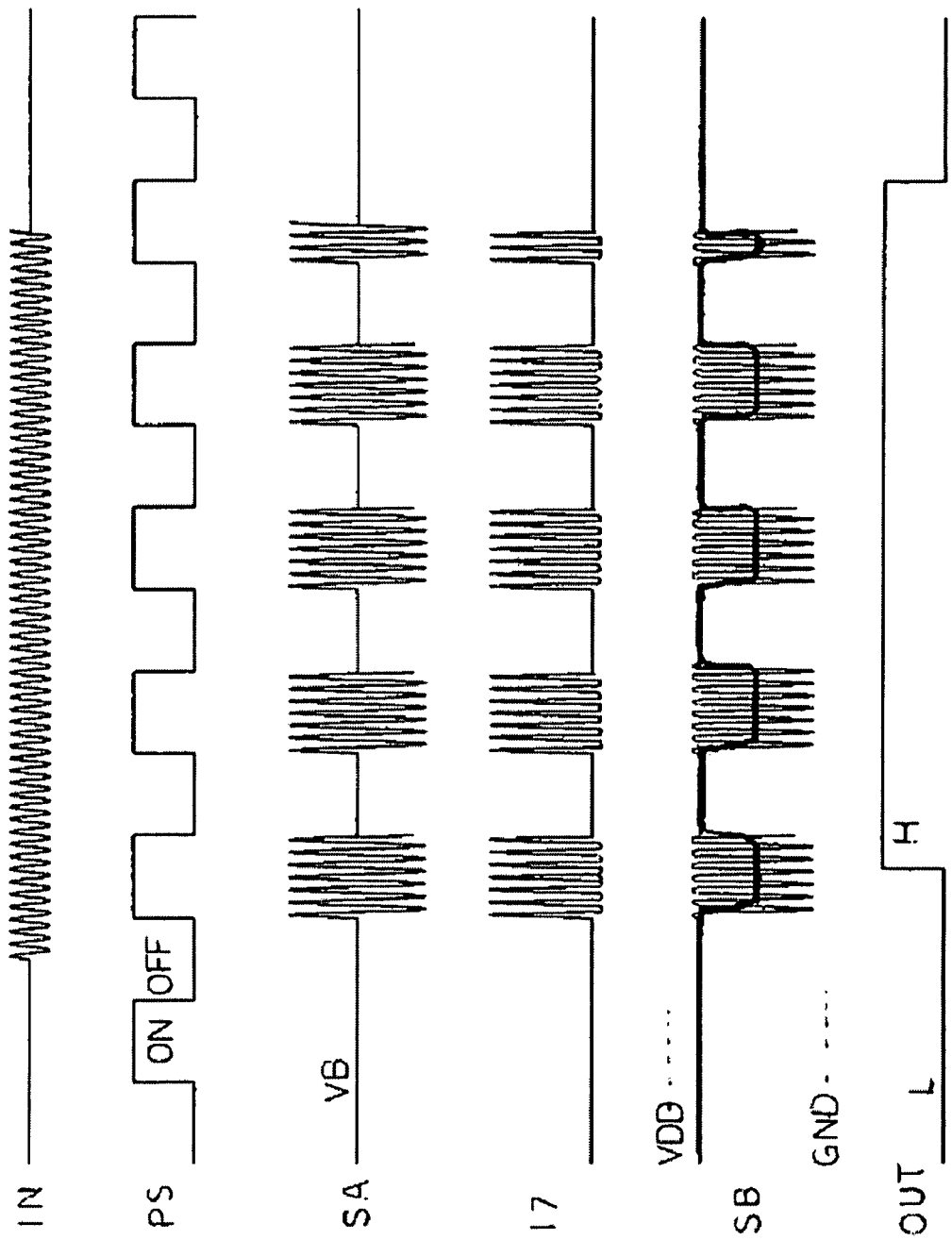
FIG. 3 is a signal waveform diagram showing an operation of the circuit of FIG. 1.

FIG. 2 is volt-ampere curve showing a relationship between a gate voltage and a drain current of the NMOS 7 used in the circuit of FIG. 1 wherein the gate voltage (Vg) is measured along the horizontal axis, and the drain current (Id) is measured along the vertical axis. Further, FIG. 3 is a signal waveform diagram showing an operation of the circuit of FIG. 1. The operation of the circuit shown in FIG. 1 is described below with reference to FIGS. 2 and 3.

The high frequency signal IN with 5 GHz received at the antenna and applied to the input terminal 1 is applied to the resonant circuit 14 including the first capacitor 4 and the inductor 5 as an intermittent ringing signal caused by the switch 3, which is on/off controlled in response to a pulse signal PS with 16 kHz, which is applied from a pulse generator 2. At the first node NA, a signal SA whose amplitude is increased by the resonant circuit 14 and whose average voltage is biased by the bias voltage VB generated by the bias voltage generator 6 is generated. The signal SA is applied to the gate of the NMOS 7.

As shown in FIG. 2, the MOS has a weak inversion region and a strong inversion region. In the weak inversion region, the drain current (Id) hardly flows even if the gate voltage (Vg) increases. On the other hand, in the strong inversion region, the drain current (Id), which is in proportion to the gate voltage (Vg) multiplied by itself, flows. The gate voltage at the boundary between the weak and the strong inversion regions is called the threshold voltage (Vth).

Generally, the relationship between the gate voltage (Vg) and the drain current (Id) on the MOS under the condition that the gate voltage less than the threshold voltage is applied to the gate of the MOS is shown by the following equations.

$$Id = I0 \exp\{(Vg - Vth)/nVt\},$$

$$I0 = \mu Cox(W/L)VT^2(n-1)$$

where "n" is a constant of the current gradient, "VT" is a thermal voltage, "μ" is mobility of holes or electrons, "Cox" is capacity of an oxide layer, "W" is a gate width and "L" is a gate length.

Since the bias voltage VB, which is the average voltage of the signal SA, is set under the threshold voltage (Vth) of the NMOS 7 of the circuit 100 shown in FIG. 1, the NMOS 7 is operated in the weak inversion region in which the drain current Id increases in proportion to an exponent function to the gate voltage Vg.

Since the bias voltage VB is set under the threshold voltage (Vth) of the NMOS 7, a current I7 passing through the NMOS 7 is a microcurrent, such as a few μA. However, since the relationship between the gate voltage to be inputted and the drain current to be outputted is the exponent function as described above, the average of the current I7 is relatively large, compared with the condition that no signal is received. Thus, the high frequency component in the signal SA is inverted and half-wave-rectified by the NMOS 7, and is outputted as a signal SB to the second node NB, which is the drain of the NMOS.

Since the second node NB is connected to the second capacitor 9 for smoothing the signal, the high frequency component of the signal SB at the second node NB is removed, and the signal SB illustrated in the bold line in FIG. 3 is outputted. The signal SB is applied to the judgment circuit 10 for judging whether or not a signal inputted has the same frequency as the pulse signal PS generated in the pulse generator 2. When the judgment circuit 10 detects the signal having 16 kHz, the level of the output signal OUT becomes "H" showing that an intended high frequency signal IN is inputted. To the contrary, when the judgment circuit 10 does not detect the signal having 16 kHz, the level of the output signal OUT becomes "L".

According to the high frequency signal detection circuit 100 of the first embodiment of the invention, the following advantages can be expected.

(1) Since the NMOS 7 can amplifying the high frequency signal IN, the faint signal can be detected without sinking into noise generated by the first capacitor 4, the inductor 5 and the NMOS 7, respectively.

(2) Since the first capacitor 4 and the inductor 5 consists of the resonant circuit 14 for the intended frequency, any signals having a frequency other than that intended may not be detected falsely.

(3) Since the bias voltage VB of the NMOS 7 is set under the threshold voltage (Vth) of the NMOS 7, the circuit 100 is operable with low power.

(4) Since all circuit elements in the high frequency signal detection circuit 100 can be formed by the a MOS, a resistors, capacitors, and an inductor, it is easy to be integrated.

The Second Embodiment

Figure 4:
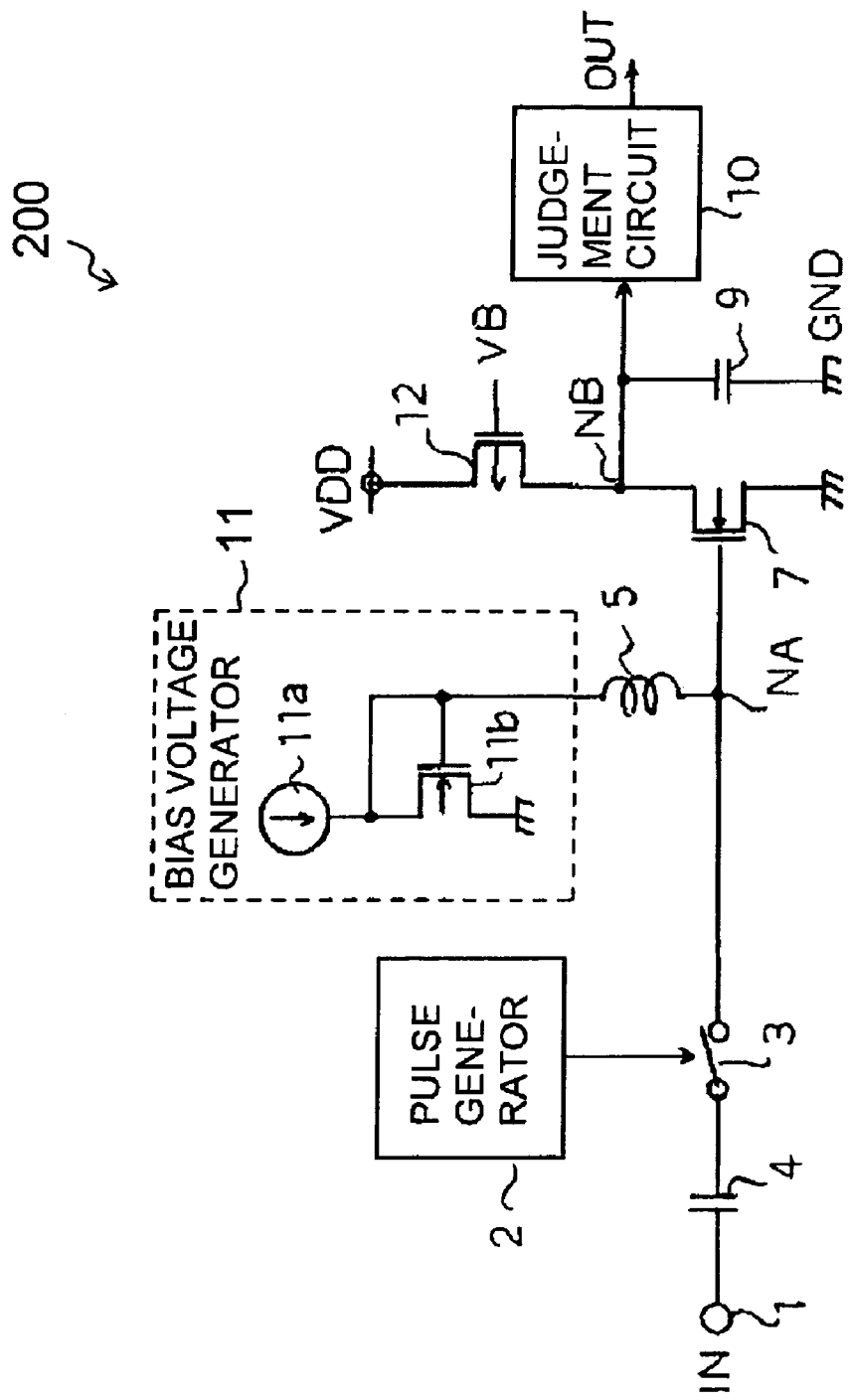
FIG. 4 is a circuit diagram of a high frequency signal detection circuit, according to the second embodiment.

FIG. 4 is a circuit diagram of a high frequency signal detection circuit, according to the second embodiment. In FIG. 4, the same reference numbers designate the same or similar components used in FIG.1.

Compared with the high frequency signal detection circuit 100, the high frequency signal detection circuit 200 includes a first capacitor 4 located between an input terminal IN and a switch 3, and a bias voltage generator 11 using a current-mirror circuit for controlling the bias current of a first NMOS 7. The bias voltage generator 11 includes a constant current generator 11a generating a constant electric current, which corresponds to the drain current at the operating point of the first NMOS 7, and a second NMOS 11b being connected between the constant current generator 11a and the ground GND. The output of the constant current generator 11a is connected to the drain of the second NMOS 11b, and the voltages at the gate and at the drain of the second NMOS 11b are applied to the gate of the first NMOS 7 via an inductor 5. Further, the resister 8 used in the circuit in FIG. 1 is replaced with a P channel MOS transistor 12 (hereinafter called PMOS) as a load resistance for the first NMOS 7. The other components used in the circuit 200 of the second embodiment shown in FIG. 4 are similar to the circuit 100 in FIG. 1.

The operation of the high frequency signal detection circuit 200 is similar to that of the circuit 100 shown in FIG. 1, and the advantages of the high frequency signal detection circuit 200 are also similar to those of the circuit 100 shown in FIG. 1.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them.

For example, (a) it is possible to switch the first capacitor 4 and the inductor 5 in response to the frequency of the high frequency signal IN inputted at the input terminal 1, (b) while the NMOS 7 is used for inversion, amplification and rectification, a PMOS, a bipolar transistor or a GaAs transistor can be replaced. Various other modifications of the illustrated embodiment will be apparent to those skilled in the art on reference to this description. Therefore, the appended claims are intended to cover any such modifications or embodiments as fall within the true scope of the invention.

What I claim is:

1. A high frequency signal detection circuit, comprising:
an input terminal for a high frequency signal to be detected;
a switch transferring the high frequency signal as an intermittent ringing signal to a first node in response to a pulse signal whose frequency is lower than that of the high frequency signal, a transistor amplifying the signal at the first node, and outputting to a second node;

a bias generator generating a bias voltage by which the transistor is operated in its weak inversion region;

a resonant circuit outputting the bias voltage to the first node, and resonating the high frequency signal;

a capacitor removing a high frequency component of the signal at the second node; and a judgment circuit judging whether or not the high frequency signal is inputted by detecting the signal at the second node, which has the same frequency as the pulse signal.

2. A high frequency signal detection circuit as claimed in claim 1, wherein the resonant circuit includes a capacitor and an inductor, wherein one end of the capacitor is connected to the switch, and the other end is connected to the first node, and wherein one end of the inductor is connected to the bias generator and the other end is connected to the first node.

3. A high frequency signal detection circuit as claimed in claim 1, further comprising a load resistance, which is connected to the drain of the transistor.

4. A high frequency signal detection circuit as claimed in claim 3, wherein the load resistance is a P channel MOS transistor.

5. A high frequency signal detection circuit as claimed in claim 1, wherein the bias generator includes a current-mirror circuit outputting the bias voltage generated in response to an electric current in the weak conversion region in which the transistor is operable.

6. A high frequency signal detection circuit as claimed in claim 5, wherein the transistor is a first transistor, wherein the current-mirror circuit includes a constant current generator generating a constant electric current, which corresponds to the drain current at the operating point of the first transistor and a second transistor being connected between the constant current generator and the ground GND, and wherein an output of the constant current generator is connected to the drain of the second transistor and the voltages at the gate and at the drain of the second transistor are applied to the gate of the first transistor.

7. A high frequency signal detection circuit as claimed in claim 1, wherein the transistor is a N type MOS transistor.

8. A high frequency signal detection circuit as claimed in claim 1, wherein the transistor is one of a P type MOS transistor, a bipolar transistor and a GaAs transistor.

* * * * *